(12) United States Patent
Rudd et al.

(10) Patent No.: US 8,068,664 B2
(45) Date of Patent: Nov. 29, 2011

(54) COMPONENT SENSOR FOR PICK AND PLACE MACHINE USING IMPROVED SHADOW IMAGING

(75) Inventors: Eric P. Rudd, Hopkins, MN (US); John P. Konicek, Minneapolis, MN (US); John D. Gaida, Victoria, MN (US)

(73) Assignee: CyberOptics Corporation

( * ) Notice: Subject to any disclaimer, the term of this patent is extended or adjusted under 35 U.S.C. 154(b) by 846 days.

(21) Appl. No.: 12/133,457

(22) Filed: Jun. 5, 2008

(65) Prior Publication Data

US 2009/0003683 A1    Jan. 1, 2009

Related U.S. Application Data

(60) Provisional application No. 60/933,287, filed on Jun. 5, 2007.

(51) Int. Cl.
G06K 9/00 (2006.01)
(52) U.S. Cl. .................................................. 382/151
(58) Field of Classification Search .................. 382/141, 382/151, 152
See application file for complete search history.

(56) References Cited

U.S. PATENT DOCUMENTS

| | | | |
|---|---|---|---|
| 3,337,941 A | 8/1967 | Drop et al. | 29/203 |
| 3,487,226 A | 12/1969 | Yetter et al. | 250/222 |
| 3,622,396 A | 11/1971 | Fernandez et al. | 136/176 |
| 3,624,401 A | 11/1971 | Stoller | 250/373 |
| 3,636,635 A | 1/1972 | Lemelson | 33/174 |
| 3,764,813 A | 10/1973 | Clement et al. | 250/221 R |
| 3,781,115 A | 12/1973 | Rader et al. | 356/167 |
| 3,854,052 A | 12/1974 | Asar et al. | 250/560 |
| 3,876,877 A | 4/1975 | Meulensteen et al. | 250/222 R |
| 3,888,362 A | 6/1975 | Fletcher et al. | 214/1 B |
| 3,905,705 A | 9/1975 | Petrohilos | 356/160 |
| 4,074,938 A | 2/1978 | Taylor | 356/160 |
| 4,144,449 A | 3/1979 | Funk et al. | 250/221 |
| 4,151,945 A | 5/1979 | Ragard et al. | 228/6 A |
| 4,247,767 A | 1/1981 | O'Brien et al. | 250/221 |
| 4,312,109 A | 1/1982 | Kawana | 29/564.6 |

(Continued)

FOREIGN PATENT DOCUMENTS
DE    28 34 836    6/1979
(Continued)

OTHER PUBLICATIONS

"New Trends in SMD Pick & Place Machines Put High Demands on Vision Systems," IECON '90, 16th Annual Conference of IEEE Industrial Electronics Society, Nov. 27-30, 1990, p. 799-804.

(Continued)

Primary Examiner — Patrick J Connolly
(74) Attorney, Agent, or Firm — Christopher R. Christenson; Westerman, Champlin & Kelly, P.A.

(57) ABSTRACT

A method of sensing a component held by a nozzle of a pick and place machine is provided. The method includes engaging a source of illumination and recording a reference background image when no component is held by the nozzle. Then, a component is adhered to the nozzle. A shadow image of the component is detected while the component is held by the nozzle. The detected shadow image of the component is adjusted based upon the recorded reference background image. Positional information relative to the component held on the nozzle is computed using the adjusted shadow image. The component is then mounted upon a workpiece using the positional information.

13 Claims, 2 Drawing Sheets

U.S. PATENT DOCUMENTS

| | | | |
|---|---|---|---|
| 4,346,293 A | 8/1982 | Fetzer | 250/222 R |
| 4,383,359 A | 5/1983 | Suzuki et al. | 29/712 |
| 4,405,233 A | 9/1983 | Grau | 356/237 |
| 4,424,588 A | 1/1984 | Satoh et al. | 382/48 |
| 4,456,378 A | 6/1984 | Goldowsky et al. | 356/373 |
| 4,553,843 A | 11/1985 | Langley et al. | 356/375 |
| 4,559,452 A | 12/1985 | Igaki et al. | 250/560 |
| 4,585,350 A | 4/1986 | Pryor | 356/625 |
| 4,598,456 A | 7/1986 | McConnell | 29/407 |
| 4,615,093 A | 10/1986 | Tews et al. | 29/407 |
| 4,628,464 A | 12/1986 | McConnell | 364/513 |
| 4,706,379 A | 11/1987 | Seno et al. | 29/740 |
| 4,733,969 A | 3/1988 | Case et al. | 356/375 |
| 4,741,621 A | 5/1988 | Taft et al. | 356/376 |
| 4,747,198 A | 5/1988 | Asai et al. | 29/407 |
| 4,776,088 A | 10/1988 | Biggs et al. | 29/834 |
| 4,794,689 A | 1/1989 | Seno et al. | 29/740 |
| 4,805,110 A | 2/1989 | Takahashi et al. | 364/468 |
| 4,812,666 A | 3/1989 | Wistrand | 250/561 |
| 4,881,319 A | 11/1989 | Yagi et al. | 29/840 |
| 4,891,772 A | 1/1990 | Case et al. | 364/562 |
| 4,905,370 A | 3/1990 | Hineno et al. | 29/740 |
| 4,973,216 A | 11/1990 | Domm | 414/744.5 |
| 5,005,978 A | 4/1991 | Skunes et al. | 356/372 |
| 5,012,115 A | 4/1991 | Asai et al. | 250/561 |
| 5,030,839 A | 7/1991 | van de Stadt | 250/561 |
| 5,035,047 A | 7/1991 | Harigane et al. | 29/740 |
| 5,039,210 A | 8/1991 | Welstead et al. | 359/36 |
| 5,040,291 A | 8/1991 | Janisiewicz et al. | 29/840 |
| 5,046,851 A | 9/1991 | Morgan | 356/375 |
| 5,060,366 A | 10/1991 | Asai | 29/739 |
| 5,088,187 A | 2/1992 | Takata et al. | 29/705 |
| 5,114,229 A | 5/1992 | Hideshima | 356/237 |
| 5,114,230 A | 5/1992 | Pryor | 356/372 |
| 5,131,139 A | 7/1992 | Oyama et al. | 29/721 |
| 5,162,866 A | 11/1992 | Tomiya et al. | 356/237 |
| 5,260,791 A | 11/1993 | Lubin | 358/160 |
| 5,278,634 A | 1/1994 | Skunes et al. | 356/400 |
| 5,293,048 A | 3/1994 | Skunes et al. | 250/561 |
| 5,309,223 A | 5/1994 | Konicek et al. | 356/375 |
| 5,331,406 A | 7/1994 | Fishbaine et al. | 356/375 |
| 5,377,405 A | 1/1995 | Sakurai et al. | 29/833 |
| 5,384,956 A | 1/1995 | Sakurai et al. | 29/834 |
| 5,455,870 A | 10/1995 | Sepai et al. | 382/147 |
| 5,467,186 A | 11/1995 | Indo et al. | 356/150 |
| 5,471,310 A | 11/1995 | Spigarelli et al. | 356/399 |
| 5,493,391 A | 2/1996 | Neal et al. | 356/121 |
| 5,493,403 A | 2/1996 | Nishi | 356/401 |
| 5,559,727 A | 9/1996 | Deley et al. | 364/559 |
| 5,566,447 A | 10/1996 | Sakurai | 295/832 |
| 5,570,993 A | 11/1996 | Onodera et al. | 414/783 |
| 5,608,642 A | 3/1997 | Onodera | 364/478.01 |
| 5,619,328 A | 4/1997 | Sakurai | 356/375 |
| 5,619,528 A | 4/1997 | Rebec et al. | 375/219 |
| 5,660,519 A | 8/1997 | Ohta et al. | 414/783 |
| 5,739,525 A | 4/1998 | Greve | 250/227.11 |
| 5,745,241 A | 4/1998 | Hashimoto | 356/384 |
| 5,749,142 A | 5/1998 | Hanamura | 29/833 |
| 5,897,611 A | 4/1999 | Case et al. | 702/150 |
| 5,900,940 A | 5/1999 | Aoshima | 356/375 |
| 5,901,241 A | 5/1999 | Koljonen et al. | 382/150 |
| 6,031,242 A | 2/2000 | Hudson | 250/548 |
| 6,100,922 A | 8/2000 | Honda et al. | 348/86 |
| 6,118,538 A | 9/2000 | Haugan et al. | 356/375 |
| 6,195,165 B1 | 2/2001 | Sayegh | 356/376 |
| 6,400,459 B1 | 6/2002 | Haugan et al. | 356/614 |
| 6,490,048 B1 | 12/2002 | Rudd et al. | 356/601 |
| RE38,025 E | 3/2003 | Skunes et al. | 356/400 |
| 6,583,884 B2 | 6/2003 | Rudd et al. | 356/601 |
| 7,545,514 B2 * | 6/2009 | Manickam et al. | 356/601 |

FOREIGN PATENT DOCUMENTS

| | | |
|---|---|---|
| DE | 30 22 803 | 4/1981 |
| EP | 062335 | 10/1982 |
| EP | 144717 | 6/1985 |
| EP | 0293175 A3 | 5/1988 |
| EP | 0374848 A3 | 12/1989 |
| EP | 0582086 | 7/1993 |
| EP | 0582171 | 2/1994 |
| GB | 2183820 | 6/1987 |
| JP | 57-017804 | 1/1982 |
| JP | 60-183507 | 9/1985 |
| JP | 60-189951 | 9/1985 |
| JP | 61-225604 | 10/1986 |
| JP | 62-008006 | 1/1987 |
| JP | 62-263405 | 11/1987 |
| JP | 62-288504 | 12/1987 |
| JP | 63-202096 | 8/1988 |
| JP | 63249018 | 10/1988 |
| JP | 63-283100 | 11/1988 |
| JP | 63-299400 | 12/1988 |
| JP | 2059231 | 2/1990 |
| JP | 2062099 | 3/1990 |
| JP | 2303751 | 12/1990 |
| JP | 3045919 | 2/1991 |
| JP | 3115538 | 5/1991 |
| JP | 4322924 | 11/1992 |
| JP | 6104596 | 4/1994 |
| JP | 6249629 | 9/1994 |
| JP | 11040991 | 2/1999 |
| JP | 11040992 | 2/1999 |
| JP | 11068397 | 3/1999 |
| JP | 11068398 | 3/1999 |
| JP | 2001-230597 | 8/2001 |
| SU | 1370456 | 1/1988 |
| WO | WO 99/49713 | 9/1999 |
| WO | WO 01/74127 A1 | 10/2001 |
| WO | WO 2007/033349 * | 3/2007 |
| WO | WO 2007/033349 A1 | 3/2007 |

OTHER PUBLICATIONS

Sanderson, Arthur C. et al., "Sensor-Based Robotic Assembly Systems: Research and Applications in Electronic Manufacturing," Proceedings of the IEEE, vol. 71, No. 7, Jul. 1983, p. 856-871.

Case, Steven K., "Laser Vision Adds Precision and Speed to Component Placement Machines," presented at NEPCON West '93, 1993, 16 pages.

Weissmantel, H., "Montage mit Robotern," VFDI-Berichte Nr. 460, 1982, pp. 63-68.

Samsung Electronics Product Literature Brochure, Jan. 2001, 2 pages.

International Search Report and Written Opinion from application PCT/US2008/007043, filed Jun. 5, 2008.

* cited by examiner

COMPONENT SENSOR FOR PICK AND PLACE MACHINE USING IMPROVED SHADOW IMAGING

CROSS-REFERENCE TO RELATED APPLICATION

The present application is based on and claims the benefit of U.S. provisional patent application Ser. No. 60/933,287, filed Jun. 5, 2007, the content of which is hereby incorporated by reference in its entirety.

BACKGROUND

Pick and place machines are generally used to manufacture electronic circuit boards. A blank printed circuit board is usually supplied to the pick and place machine, which then picks individual electronic components from component feeders, and places such components upon the board. The components are held upon the board temporarily by solder paste, or adhesive, until a subsequent step in which the solder paste is melted or the adhesive is fully cured. The individual electronic components must be placed precisely on the circuit board in order to ensure proper electrical contact, thus requiring correct angular orientation and lateral positioning of the component upon the board.

Pick and place machine operation is challenging. In order to drive the cost of the manufactured circuit board down, the machine must operate quickly to maximize the number of components placed per hour. However, as the state-of-the-art of the electronics industry has advanced, the sizes of the components have decreased and the density of interconnections has increased. Accordingly, the acceptable tolerance on component placement has decreased markedly. Actual pick and place machine operation often requires a compromise in speed to achieve an acceptable level of placement accuracy.

One way in which pick and place machine operation is efficiently sped up is in the utilization of a sensor that is able to accurately evaluate both the position and angular orientation of a picked component upon a vacuum nozzle or quill, while the component is in transit to the placement site. Such sensors essentially allow the task of determining the component position and orientation upon the vacuum quill to be performed without any impact on placement machine speed, unlike systems that require separate motion to a fixed alignment sensor. Such sensors are known, and are commercially available from CyberOptics Corporation, of Golden Valley, Minn., under the trade designation Model LNC-60. Several aspects of these sensors are described in U.S. Pat. Nos. 5,278, 634; 6,490,048; and 6,583,884.

These laser-based alignment sensors are used in pick and place machines to measure the offset (x, y and θ) and size ($S_x$, $S_y$) of picked components. Laser-based alignment sensors generally transmit the measured offset values to the pick and place machine controller, so that the controller of the machine can correct for the offset and accurately place the component upon the circuit board at the placement site. Additionally, the part size ($S_x$, $S_y$) features are also measured and transmitted to the pick and place machine allowing the pick and place machine to detect incorrect part size, or other problems.

In a focused imaging system, the relatively large numerical apertures used to acquire images tend to cause dust on intervening surfaces to be appreciably out of focus, which in turn minimizes the effect of dust on the image. However, for reasons of compactness and low cost, it is often desirable to use shadow imaging. Shadow imaging is a technique where illumination is cast upon a component to be detected, and the detector is placed behind the component to detect the shadow cast by the component as the component block some of the illumination. Unfortunately, with shadow imaging, Fresnel diffraction can cause serious disturbances to the image even from a small dust mote.

Providing a shadow-image sensing component sensor for pick and place machines with an improved resistance to disturbances caused by Fresnel diffraction would benefit the art of automated electronics assembly.

SUMMARY

A method of sensing a component held by a nozzle of a pick and place machine is provided. The method includes engaging a source of illumination and recording a reference background image when no component is held by the nozzle. Then, a component is adhered to the nozzle. A shadow image of the component is detected while the component is held by the nozzle. The detected shadow image of the component is compensated based upon the recorded reference background image. Positional information relative to the component held on the nozzle is computed using the adjusted shadow image. The component is then mounted upon a workpiece using the positional information.

DETAILED DESCRIPTION OF ILLUSTRATIVE EMBODIMENTS

Figure 1:
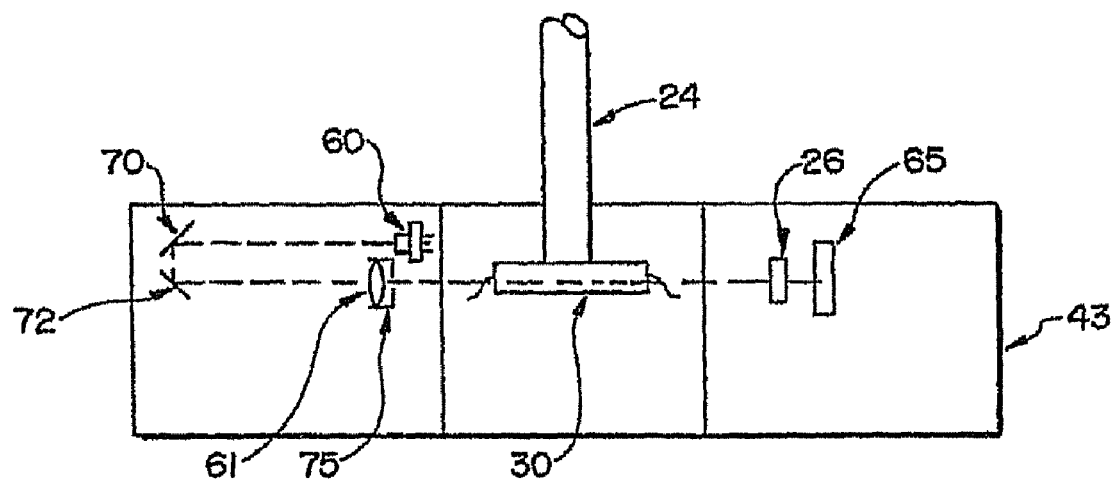
FIG. 1 is an elevation view illustrating a diagrammatic alignment sensor with which embodiments of the present invention are particularly useful.
Figure 2:
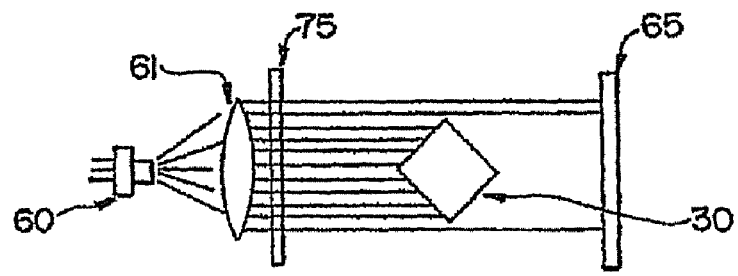
FIG. 2 is a plan view illustrating a diagrammatic laser-based alignment sensor with which embodiments of the present invention are particularly useful.

FIGS. 1 and 2 are elevation and plan views illustrating a diagrammatic laser-based alignment sensor with which embodiments of the present invention are particularly useful. One or more vacuum quills or nozzles 24 are used to pick up components, such as component 30, from a feeder, such as a tape feeder, and move the component 30 to a placement location upon a circuit board. While component 30 is undergoing the relative motion to its placement site, sensor 43 is able to determine both the location of component 30 upon vacuum quill 24, as well as the rotational orientation of component 30 upon vacuum quill 24. In the example illustrated in FIGS. 1 and 2, a source of monochromatic illumination, such as laser diode 60, directs illumination away from part 30. Two reflecting mirrors 70, 72, direct the laser light beam through collimating lens 61, and slit aperture 75, past electronic component 30 with that portion of the laser beam or stripe which passes the edge of component 30 being filtered by optical filter 26 to strike linear CCD array 65, which then provides data to be processed for angular orientation and x, y location. While the illumination is energized, vacuum quill 24, and accordingly, component 30, are rotated and the corresponding movement of shadows upon linear CCD array 65 are used to calculate the angular orientation and x, y location.

Since the sensor uses shadow imaging with collimated light, if a dust mote is lodged on either of mirrors 70, 72 or lens 61, Fresnel diffraction can occur and cause undesirable effects. If the shadows from dust motes were completely black, the light being completely obstructed by an opaque dust mote, information could be completely lost in the shadow region. Fortunately, in a shadow-imaging system, the dust shadows are not usually very deep; that is, even in the center of the shadow there is usually an appreciable amount of light. Though the successive attenuation of light by a dust mode and a component involves complicated multiple Fresnel diffraction, a good approximation is to assume that the two effects are purely multiplicative. Irregularities in the shadow image can, therefore, be substantially corrected by simple and practical normalization schemes. In accordance with one embodiment of the present invention, irregularities in the shadow image are recorded by obtaining and storing a reference background image when illumination is engaged, but no component is present on the nozzle or quill. Then, the stored reference background image is used to compensate subsequent images of components on the nozzle in order to remove irregularities. This compensation is preferably done using suitable arithmetic operations on a pixel-by-pixel basis.

Figure 3:
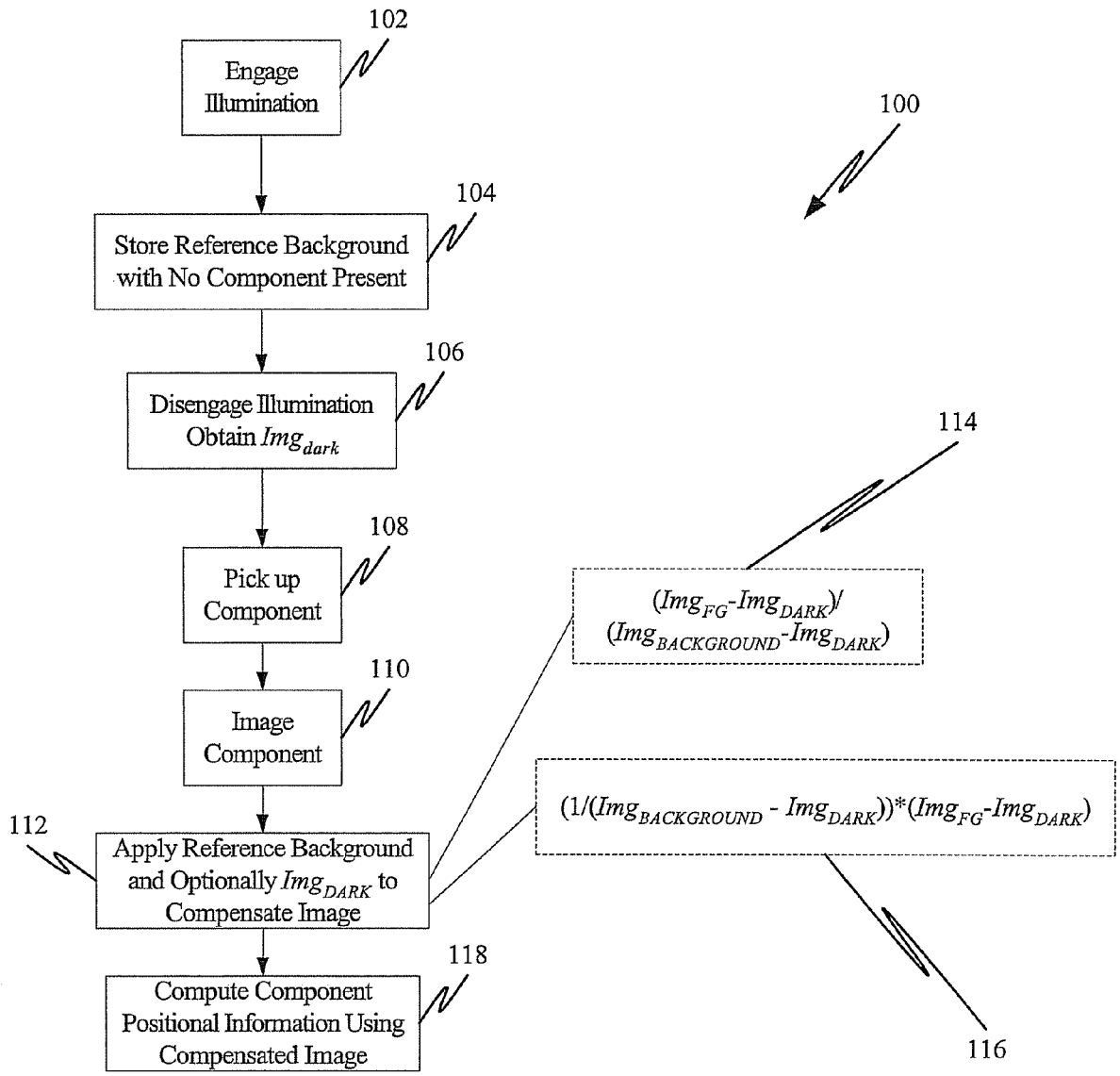
FIG. 3 is a flow diagram of a method of operating a component sensor of a pick and place machine in accordance with an embodiment of the present invention.

FIG. 3 is a flow diagram of a method of operating a component sensor of a pick and place machine in accordance with an embodiment of the present invention. Method 100 begins at block 102 where the illumination source, such as laser diode 60, is engaged to generate illumination. As used herein, "illumination" is intended to mean any suitable electromagnetic radiation that can be obstructed by a component to generate a detectable shadow. Thus, illumination can be visible or invisible to the human eye; can be structured or unstructured; and can be monochromatic or polychromatic.

At block 104, the image detected by detector 65 is stored while the illumination source is engaged, and while no component is present on the nozzle. This stored image is referred to hereinafter as $Img_{BACKGROUND}$. At block 106, the illumination is disengaged, and an image is detected from detector 65 while no illumination is present. This stored image is referred to hereinafter as $Img_{DARK}$. Note, while block 106 is illustrated as occurring after blocks 102 and 104, that sequence is arbitrary, and embodiments of the present invention can be practiced where block 106 precedes blocks 102 and 104.

At block 108, component 30 is picked up by nozzle 24. At block 110, detector 65 takes an image of component 30, which image is referred to hereinafter as $Img_{FG}$. At block 112, $Img_{FG}$ is adjusted, or otherwise compensated using $Img_{BACKGROUND}$ and preferably $Img_{DARK}$. Phantom blocks 114 and 116 illustrate different ways in which block 112 can be performed. Block 114 shows a pixel-by-pixel operation where each adjusted pixel is computed as follows:

$$Img_{ADJUSTED}=(Img_{FG}-Img_{DARK})/(Img_{BACKGROUND}-Img_{DARK})$$

Thus, block 114 illustrates an operation where the component image is divided by the reference background image ($Img_{BACKGROUND}$), and both images $Img_{FG}$ and $Img_{BACKGROUND}$ are adjusted by subtracting $Img_{DARK}$. This division removes the irregularities, as long as they are stable over time, but the shadow of component 30 is not canceled by this technique because it appears only in $Img_{FG}$. Additionally, in situations where $Img_{DARK}$ is sufficiently dark, or darker than a selected threshold, all pixels of $Img_{DARK}$ can be set to zero ($Img_{DARK}=0$). The selected threshold can be determined for each application and/or through experimentation. Further, each pixel can be multiplied by a selected constant (r) that is chosen to maximize the video level in the adjusted image without significant risk of clipping on overshoots.

Block 116 does a similar operation, but since division is relatively difficult in digital hardware, the reciprocal of the reference background image is stored ($1/Img_{BACKGROUND}$). Moreover, if the variations are small enough, they can be approximately removed using subtraction, which is easier still.

At block 118, the adjusted image $Img_{ADJUSTED}$ is used to compute component positional information, such as (x, y and $\theta$) and size ($S_x$, $S_y$) in accordance with known techniques. This positional information relative to the component is then used to mount the component upon a workpiece, such as a printed circuit board.

Since the only condition necessary to record a reference background image is the absence of a component in the sensor's field of view, it is practical, and preferable, to perform this calibration automatically on a periodic basis during operation. With such periodic calibration, it is believed that embodiments of the present invention will allow compensation for slow accumulation of dust on exposed optical surfaces, which means that cleaning is needed less frequently.

Although the present invention has been described with reference to preferred embodiments, workers skilled in the art will recognize that changes may be made in form and detail without departing from the spirit and scope of the invention.

What is claimed is:

1. A method of sensing a component held by a nozzle of a pick and place machine, the method comprising:
    engaging a source of illumination and recording a reference background image when no component is held by the nozzle;
    adhering a component to the nozzle;
    detecting a shadow image of the component while the component is held by the nozzle;
    adjusting the detected shadow image of the component based upon the recorded reference background image;
    computing positional information relative to the component held on the nozzle using the adjusted shadow image, and mounting the component upon a workpiece; and
    disengaging the source of illumination and recording a dark image ($Img_{DARK}$), and subtracting the dark image from the reference background image and from the detected shadow image of the component.

2. The method of claim 1, wherein adjusting the detected shadow image includes dividing the detected shadow image by the reference background image ($Img_{BACKGROUND}$).

3. The method of claim 1, wherein adjusting the detected shadow image includes multiplying the detected shadow image by a reciprocal of the reference background image ($Img_{BACKGROUND}$).

4. The method of claim 1, wherein adjusting the detected shadow image includes dividing the detected shadow image by the reference background image ($Img_{BACKGROUND}$).

5. The method of claim 1, wherein adjusting the detected shadow image includes multiplying the detected shadow image by a reciprocal of the reference background image ($Img_{BACKGROUND}$).

6. The method of claim 1, wherein the method is performed periodically.

7. The method of claim 6, wherein the method is performed automatically.

8. The method of claim 1, wherein the method is performed automatically.

9. The method of claim 1, wherein Fresnel diffraction from a dust mote is reduced.

10. The method of claim 1, wherein the illumination is monochromatic illumination.

11. The method of claim 10, wherein the illumination is structured illumination.

12. The method of claim 11, wherein the illumination is visible.

13. The method of claim 1, wherein each pixel is multiplied by a constant that is chosen to increase video level without clipping.

* * * * *